United States Patent
Liu et al.

(10) Patent No.: US 10,580,886 B2
(45) Date of Patent: Mar. 3, 2020

(54) INCREASED SOURCE AND DRAIN CONTACT EDGE WIDTH IN TWO-DIMENSIONAL MATERIAL FIELD EFFECT TRANSISTORS BY DIRECTED SELF-ASSEMBLY

(71) Applicant: International Business Machines Corporation, Armonk, NY (US)

(72) Inventors: Chi-Chun Liu, Altamont, NY (US); Chun Wing Yeung, Niskayuna, NY (US); Chen Zhang, Albany, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/991,023

(22) Filed: May 29, 2018

(65) Prior Publication Data

US 2019/0371925 A1 Dec. 5, 2019

(51) Int. Cl.
*H01L 29/06* (2006.01)
*H01L 29/76* (2006.01)
(Continued)

(52) U.S. Cl.
CPC .... *H01L 29/7606* (2013.01); *H01L 21/02118* (2013.01); *H01L 21/3081* (2013.01);
(Continued)

(58) Field of Classification Search
CPC .................................................. H01L 29/7606
USPC ........................................................... 257/29
See application file for complete search history.

(56) References Cited

U.S. PATENT DOCUMENTS 8,471,237 B2 6/2013 Okai et al.
8,884,345 B2 11/2014 Heo et al.
(Continued)

FOREIGN PATENT DOCUMENTS

JP 2016127238 A * 7/2016
WO 2016071317 A1 5/2016

OTHER PUBLICATIONS

L. Wang et al., "One-Dimensional Electrical Contact to a Two-Dimensional Material," Science, vol. 342, 2013, pp. 614-617.
(Continued)

*Primary Examiner* — Ajay Arora
(74) *Attorney, Agent, or Firm* — Amin, Turocy & Watson, LLP

(57) ABSTRACT

The present invention provides a method and a structure of increasing source and drain contact edge width in a two-dimensional material field effect transistor. The method includes patterning a two-dimensional material over an insulating substrate; depositing a gate dielectric over the two-dimensional material; depositing a top gate over the gate dielectric, wherein the top gate has a hard mask thereon; forming a sidewall spacer around the top gate; depositing an interlayer dielectric oxide over the sidewall spacer and the hard mask; removing the interlayer dielectric oxide adjacent to the sidewall spacer to form an open contact trench; depositing a copolymer coating in the contact trench region; annealing the copolymer to induce a directed self-assembly; performing a two-dimensional material etch over the two-dimensional material; removing the unetched copolymer without etching the gate dielectric; and etching the exposed gate in the source and the drain region to form a metal contact layer.

9 Claims, 11 Drawing Sheets

Cross section AA

Top down view

(51) Int. Cl.
  H01L 29/16    (2006.01)
  H01L 29/20    (2006.01)
  H01L 29/04    (2006.01)
  H01L 21/308   (2006.01)
  H01L 29/66    (2006.01)
  H01L 21/768   (2006.01)
  H01L 21/02    (2006.01)
  H01L 21/311   (2006.01)

(52) U.S. Cl.
  CPC .. *H01L 21/31144* (2013.01); *H01L 21/76816* (2013.01); *H01L 29/04* (2013.01); *H01L 29/1606* (2013.01); *H01L 29/2003* (2013.01); *H01L 29/66045* (2013.01); *H01L 29/66446* (2013.01)

(56) References Cited

U.S. PATENT DOCUMENTS

| | | |
|---|---|---|
| 9,054,215 B2 | 6/2015 | Nyhus et al. |
| 9,236,292 B2 | 1/2016 | Romero et al. |
| 2002/0004304 A1* | 1/2002 | Pan .................. H01L 21/28052 |
| | | 438/689 |
| 2004/0136866 A1* | 7/2004 | Pontis .................... B82Y 10/00 |
| | | 422/400 |
| 2004/0233714 A1* | 11/2004 | Morikawa ................ G11C 7/22 |
| | | 365/185.04 |
| 2012/0199815 A1 | 8/2012 | Kondo et al. |
| 2018/0151429 A1* | 5/2018 | Wang ................. H01L 21/28518 |

OTHER PUBLICATIONS

A. Meersha et al., "Record low metal—(CVD) graphene contact resistance using atomic orbital overlap engineering," International Electron Devices Meeting, IEDM, 2016, pp. 5.3.1-5.3.4.

C. T. Black et al., "High-capacity, self-assembled metal-oxide-semiconductor decoupling capacitors," IEEE Electron Device Letters, vol. 25, No. 9, 2004, pp. 622-624.

C, Ma et al., "Seamless Staircase Electrical Contact to Semiconducting Graphene Nanoribbons," Nano Letters, vol 17, No. 10, 2017, pp. 6241-6247.

* cited by examiner

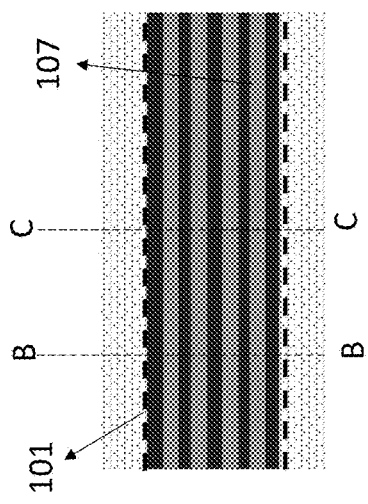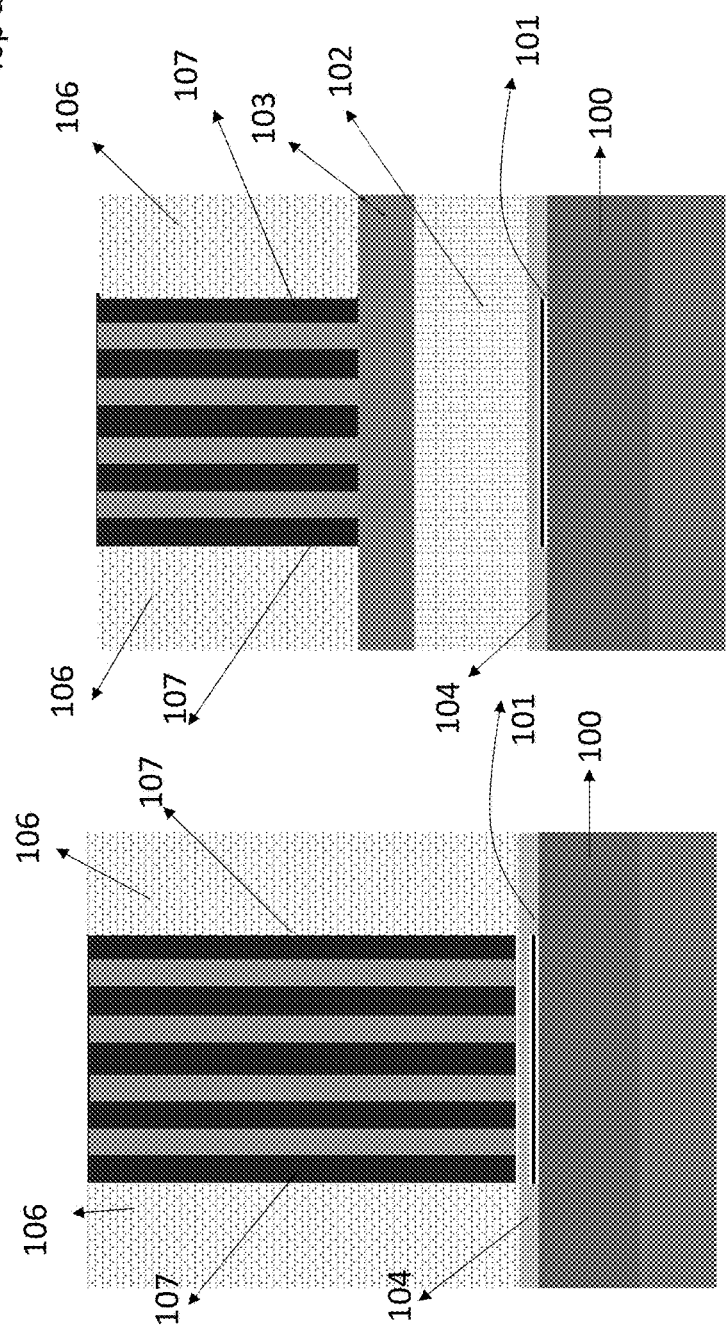
Fig. 11

INCREASED SOURCE AND DRAIN CONTACT EDGE WIDTH IN TWO-DIMENSIONAL MATERIAL FIELD EFFECT TRANSISTORS BY DIRECTED SELF-ASSEMBLY

FIELD OF THE INVENTION

The present invention relates to increasing source and drain contact edge width in two-dimensional material field effect transistors. More particularly, the present invention relates to increasing source and drain contact edge width in two-dimensional material field effect transistors by directed self-assembly.

BACKGROUND

Field effect transistors are transistors that use an electrical field to control the electrical behavior of the device. Two-dimensional materials hold potential for enabling further transistor scaling as well as other unique applications. The contact to the edge of a two-dimensional material is more efficient than to its top surface. Thus, it is preferred to have a contact structure with large total edge width.

SUMMARY

The following presents a summary to provide a basic understanding of one or more embodiments of the invention. This summary is not intended to identify key or critical elements or delineate any scope of the particular embodiments or any scope of the claims. Its sole purpose is to present concepts in a simplified form as a prelude to the more detailed description that is presented later. In one or more embodiments described herein, devices and methods of increasing source and drain contact edge width in a two-dimensional material field effect transistor are described.

According to an embodiment, a method of increasing source and drain contact edge width in a two-dimensional material field effect transistor is provided. The method can include patterning a two-dimensional material over an insulating substrate to define a channel width; depositing a gate dielectric over and in contact with the two-dimensional material; depositing a top gate over the gate dielectric, wherein the top gate has a hard mask thereon; forming a sidewall spacer around the top gate and the hard mask thereon; depositing an interlayer dielectric oxide over the sidewall spacer and the hard mask; removing the interlayer dielectric oxide adjacent to the sidewall spacer to form an open contact trench; depositing a cylinder-forming block copolymer coating in the contact trench region over the gate dielectric; annealing the cylinder-forming block copolymer to induce a directed self-assembly; etching over the cylinder-forming block copolymer coating to form a template; etching the gate dielectric using the template to expose the two-dimensional material underneath; performing a two-dimensional material etch over the two-dimensional material; selectively removing the unetched cylinder-forming block copolymer without etching the gate dielectric; and etching the exposed gate in the source region and the drain region to form a metal contact layer over the two-dimensional material.

According to another embodiment, a two-dimensional material field effect transistor is provided. The two-dimensional material field effect transistor can include a two-dimensional material disposed on an insulating substrate; a recessed gate dielectric disposed on the two-dimensional material; a top gate and a hard mask thereon disposed on the recessed gate dielectric; a sidewall spacer disposed on the recessed gate dielectric, the top gate, and the hard mask; an interlayer dielectric oxide disposed on the hard mask; and a gate metal contact layer disposed on the two-dimensional material.

According to another embodiment, a method of increasing source and drain contact edge width in a two-dimensional material field effect transistor is provided. The method can include patterning a two-dimensional material over an insulating substrate to define a channel width; depositing a gate dielectric over and in contact with the two-dimensional material; depositing a top gate over the gate dielectric, wherein the top gate has a hard mask thereon; forming a sidewall spacer around the top gate and the hard mask thereon; depositing an interlayer dielectric oxide over the top gate and the hard mask thereon; removing the interlayer dielectric oxide adjacent to the top gate, the hard mask thereon, the source region, and the drain region; depositing a lamella-forming block copolymer coating into the trench region in the interlayer dielectric oxide; annealing the lamella-forming block copolymer to induce a directed self-assembly; etching over the lamella-forming block copolymer coating; etching over the gate dielectric to expose the two-dimensional material; performing a two-dimensional material etch over the two-dimensional material; selectively removing the unetched lamella-forming block copolymer materials without etching gate dielectric and interlayer dielectric oxide; and etching the exposed gate dielectric in the source region and the drain region to form a gate metal contact layer over the two-dimensional material.

BRIEF DESCRIPTION OF THE DRAWINGS

Embodiments will be described in more detail in conjunction with the accompanying drawings, in which:

FIG. 11 illustrates a cross section views BB and CC, and a top down view of another embodiment of depositing a lamella-forming block copolymer coating within the trench opening in interlayer dielectric oxide including the source and drain region and the region over the gate and annealing to induce the directed self-assembly.

DETAILED DESCRIPTION OF THE PREFERRED EMBODIMENTS

Figure 1:
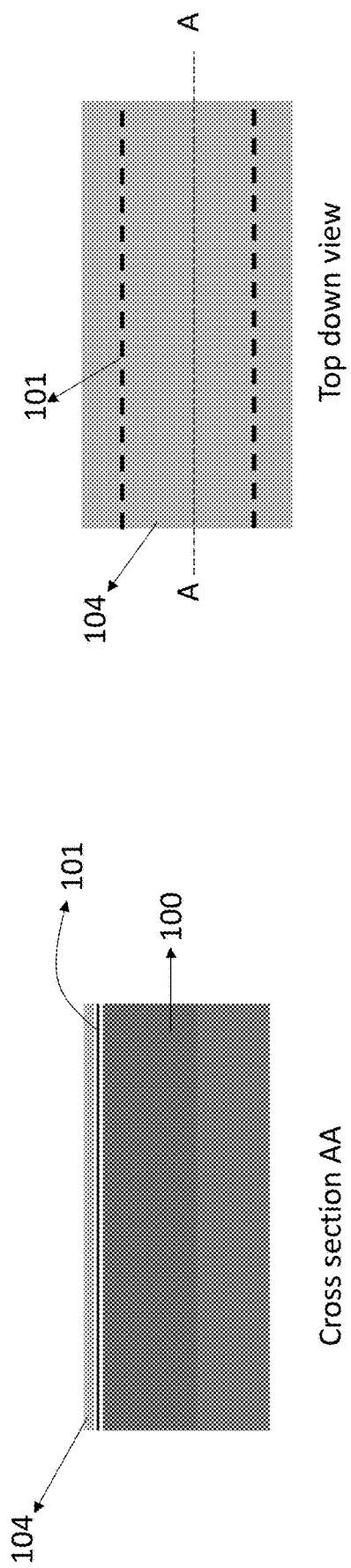
FIG. 1 illustrates a cross section view and a top down view of depositing a two-dimensional material over an insulating substrate; patterning the two-dimensional material to define a channel width; and depositing a gate dielectric over and in contact with the two-dimensional material.

It is understood in advance that, although this detailed description includes a description of increasing source and drain contact edge width in a two-dimensional material field effect transistor, implementation of the teachings recited herein are not necessarily limited to a particular type of process or device structure. Rather embodiments of the present invention are capable of being implemented in conjunction with any other type of process or device structure, now known or later developed.

Various embodiments of the present invention are described herein with reference to the related drawings in the figures. The figures are intended for illustrative purposes and, as such, are not necessarily drawn to scale. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the described embodiments of the present invention are not intended to be limiting in this respect. Accordingly, a coupling of entities can refer to either a direct or an indirect coupling, and a positional relationship between entities can be a direct or indirect positional relationship. As an example of an indirect positional relationship, references in the detailed description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (i.e., rotated 90 degrees or at other orientations), and the spatially relative descriptors used herein should be interpreted accordingly.

For the sake of brevity, conventional techniques related to semiconductor device and IC fabrication may not be described in detail herein. Moreover, the various tasks and process steps described herein may be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, and atomic layer deposition (ALD) among others. Deposition also includes a so-called epitaxial growth process which deposits single crystalline material on a single crystalline substrate.

Turning now to aspects of the present invention, embodiments of the invention provide a novel device structure and method for increasing source and drain contact edge width in two-dimensional field effect transistors by directed self-assembly.

Removal/etching is any process that removes material from the wafer. Examples include etch processes (either wet or dry), and chemical-mechanical planarization (CMP), and the like. A dry etch process such as reactive ion etching (RIE) uses chemically reactive plasma to remove a material, such as a masked pattern of semiconductor material, by exposing the material to a bombardment of ions that dislodge portions of the material from the exposed surface. The plasma is generated under low pressure (vacuum) by an electromagnetic field.

Semiconductor doping is the modification of electrical properties by doping, for example, transistor sources and drains, generally by diffusion and/or by ion implantation. These doping processes are followed by furnace annealing or rapid thermal annealing. Annealing serves to activate the implanted dopants. Selective doping of various layers of the semiconductor substrate allows the conductivity of the substrate to be changed with the application of voltage. By creating structures of these various components, millions of transistors can be built and wired together to form the complex circuitry of a modern microelectronic device.

Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The gate metal contact layer is electrically insulated from the main semiconductor n-channel or p-channel by a thin layer insulating material, for example, silicon dioxide or high dielectric constant (high-k) dielectrics, which makes the input resistance of the transistor relatively high.

A monomer is a molecule that, as a unit, has chemical functional groups which can bind covalently to same or different kind of monomers to form a polymer. When two or more different monomers are involved in polymerization, the product is called a copolymer and the process is called copolymerization. Copolymers can be classified based on how their constituent or structural units are arranged. These classifications can include alternating copolymers, periodic copolymers, statistical copolymers, and block copolymers.

FIG. 1 illustrates a cross section view AA and a top down view AA of depositing a two-dimensional material 101 over an insulating substrate 100. The insulating substrate 100 can be a material such as silicon dioxide (SiO2). The insulating substrate 100 can have a lateral width from about 5 nm to about 100 nm and ranges there between. A two-dimensional material 101 can be a material such as graphene, hexagonal boron nitride (BN), and the transition metal dichalcogenides (TMDCs). Transition metal dichalcogenides are atomically thin semiconductors of the type MX2 with M a transition metal atom such as molybdenum or tungsten and X as a chalcogen atom such as sulfur, selenium, or tellurium. Transition metal dichalcogenides are often combined with other two-dimensional materials 101 such as graphene and hexagonal boron nitride to make van der Waals heterostructures. Two-dimensional materials can be synthesized using a chemical vapor deposition (CVD) method. The reasoning is that CVD can provide large area, high quality, and well controlled layered growth of two-dimensional materials 101. Alternatively, a two-dimensional material 101 can be transferred from other substrates to the insulating substrate 100.

In FIG. 1, patterning is performed on the two-dimensional material 101 to define a channel width. Additionally, a gate dielectric 104 is deposited over the two-dimensional material 101. The gate dielectric 104 can be composed of a material such as silicon dioxide or silicon nitride or high-k dielectric such as HfO2. The gate dielectric 104 can have a lateral width from about 10 nm to about 100 nm and ranges there between. The deposition of the gate dielectric 104 can be achieved through any number of well-known thin film deposition techniques, such as through atomic layer deposition, chemical vapor deposition, plasma deposition, sputtering, spin coating, etc.

Figure 2:
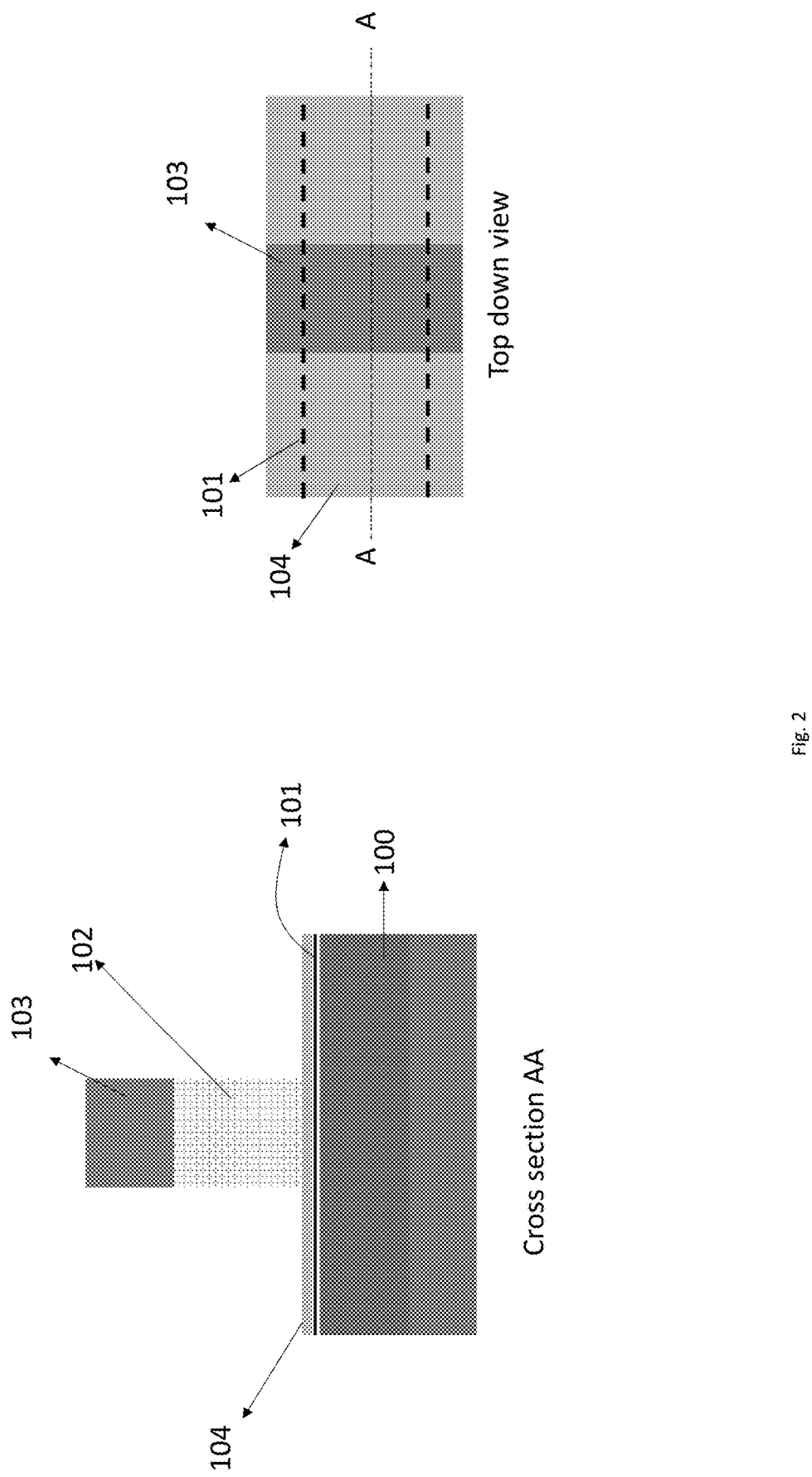
FIG. 2 illustrates a cross section view and a top down view of depositing a top gate having a hard mask thereon over the gate dielectric.

FIG. 2 illustrates a cross section view AA and a top down view AA of depositing a top gate 102 having a hard mask thereon 103 over the gate dielectric 104. The top gate 102 can be a material such as amorphous silicon. The hard mask 103 can be a material such as silicon nitride. Alternatively, the hard mask 103 can contain multiple materials arranged in any forms, including but not limited to silicon nitride, polysilicon, amorphous silicon, and silicon oxide. The hard mask 103 can have a lateral width from about 5 to about 25 nm and ranges there between.

Figure 3:
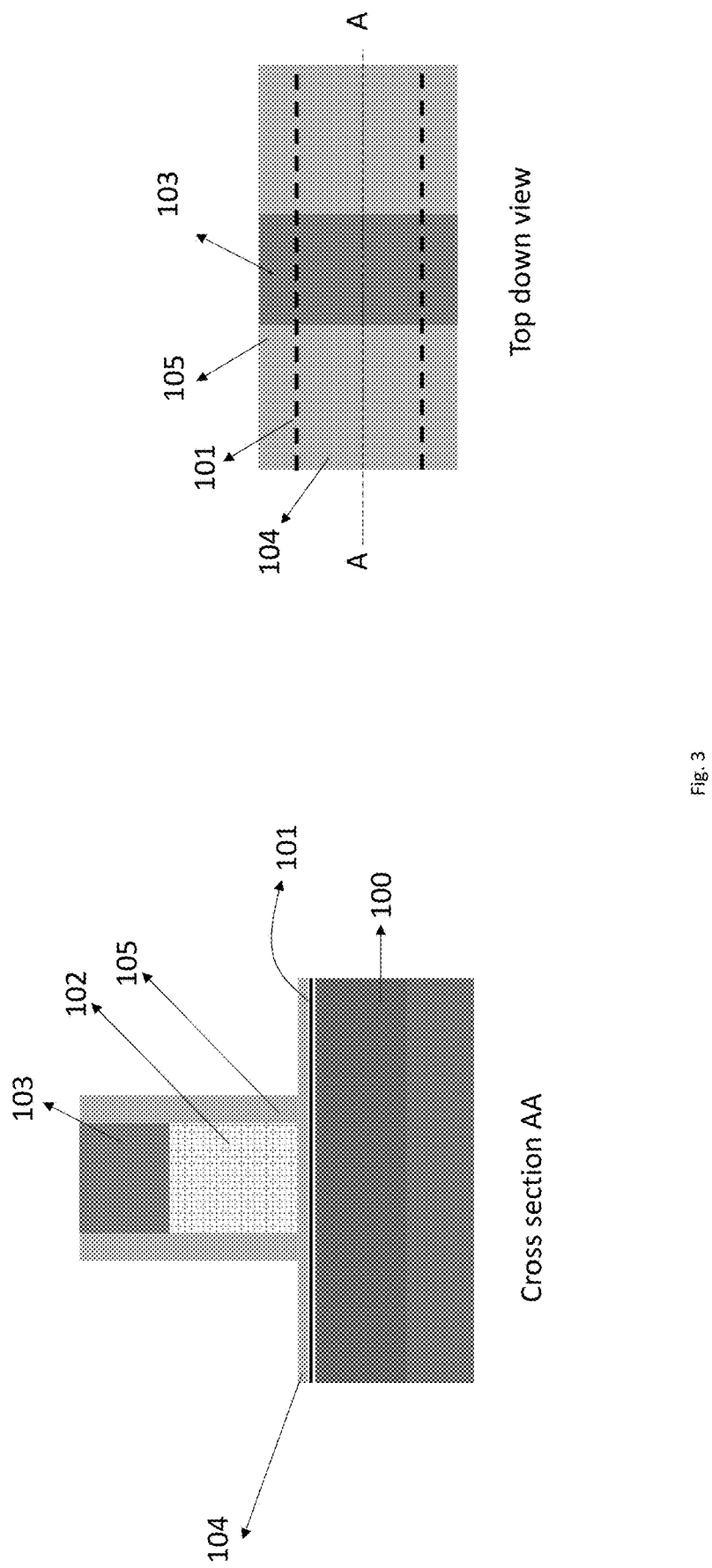
FIG. 3 illustrates a cross section view and a top down view of forming a sidewall spacer around the top gate having the hard mask thereon.

FIG. 3 illustrates a cross section view AA and a top down view AA of forming a sidewall spacer 105 around the top gate 102 having the hard mask thereon 103. The sidewall spacer 105 can be formed by techniques such as lithography. The sidewall spacer 105 can be a material such as silicon nitride. The sidewall spacer 105 can be formed by a deposition or reaction of a sidewall spacer film layer on a previous sidewall spacer pattern. The sidewall spacer 105 can have a lateral width from about 4 nm to about 30 nm and ranges there between.

Figure 4:
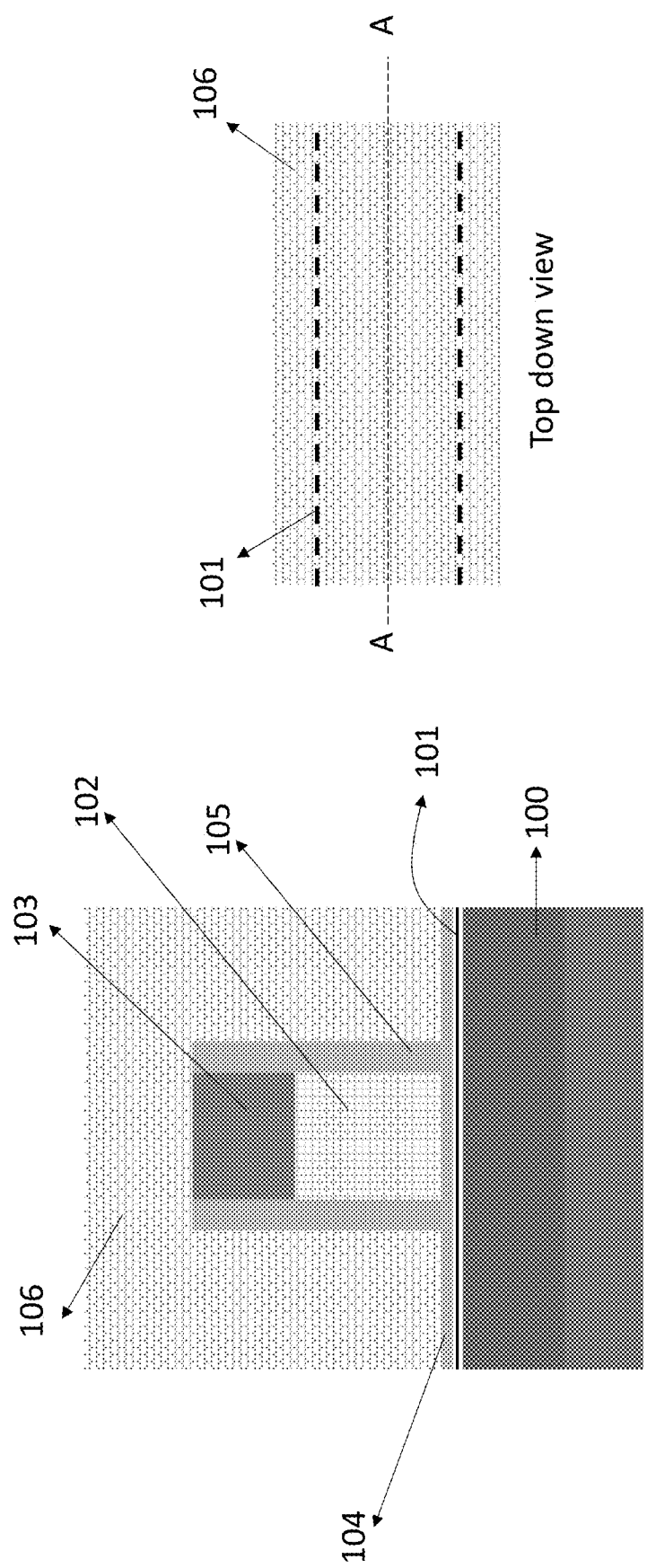
FIG. 4 illustrates a cross section view and a top down view of depositing an interlayer dielectric oxide over the sidewall spacer and the hard mask.

FIG. 4 illustrates a cross section view AA and a top down view AA of depositing an interlayer dielectric oxide 106 over the sidewall spacer 105 and the hard mask 103. The interlayer dielectric oxide 106 can have a low dielectric constant (low-k), which is a material with a small dielectric constant relative to silicon dioxide.

Figure 5:
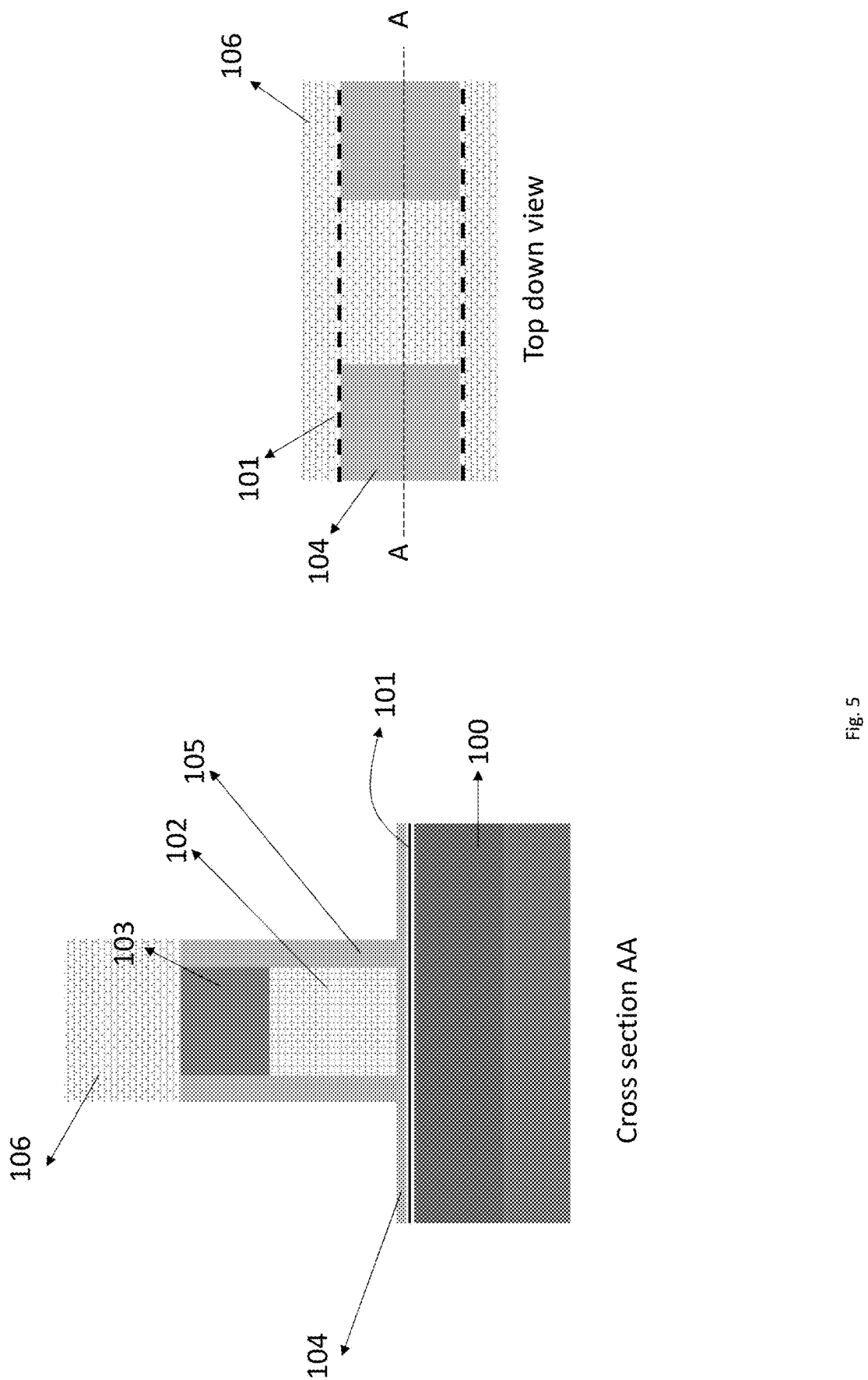
FIG. 5 illustrates a cross section view and a top down view of removing the interlayer dielectric oxide adjacent to the sidewall spacer to form an open contact trench.

FIG. 5 illustrates a cross section view AA and a top down view AA of using lithography adjacent to the sidewall spacer 105 to remove the interlayer dielectric oxide 106 adjacent to the sidewall spacer 105 to create an open contact trench.

Figure 6:
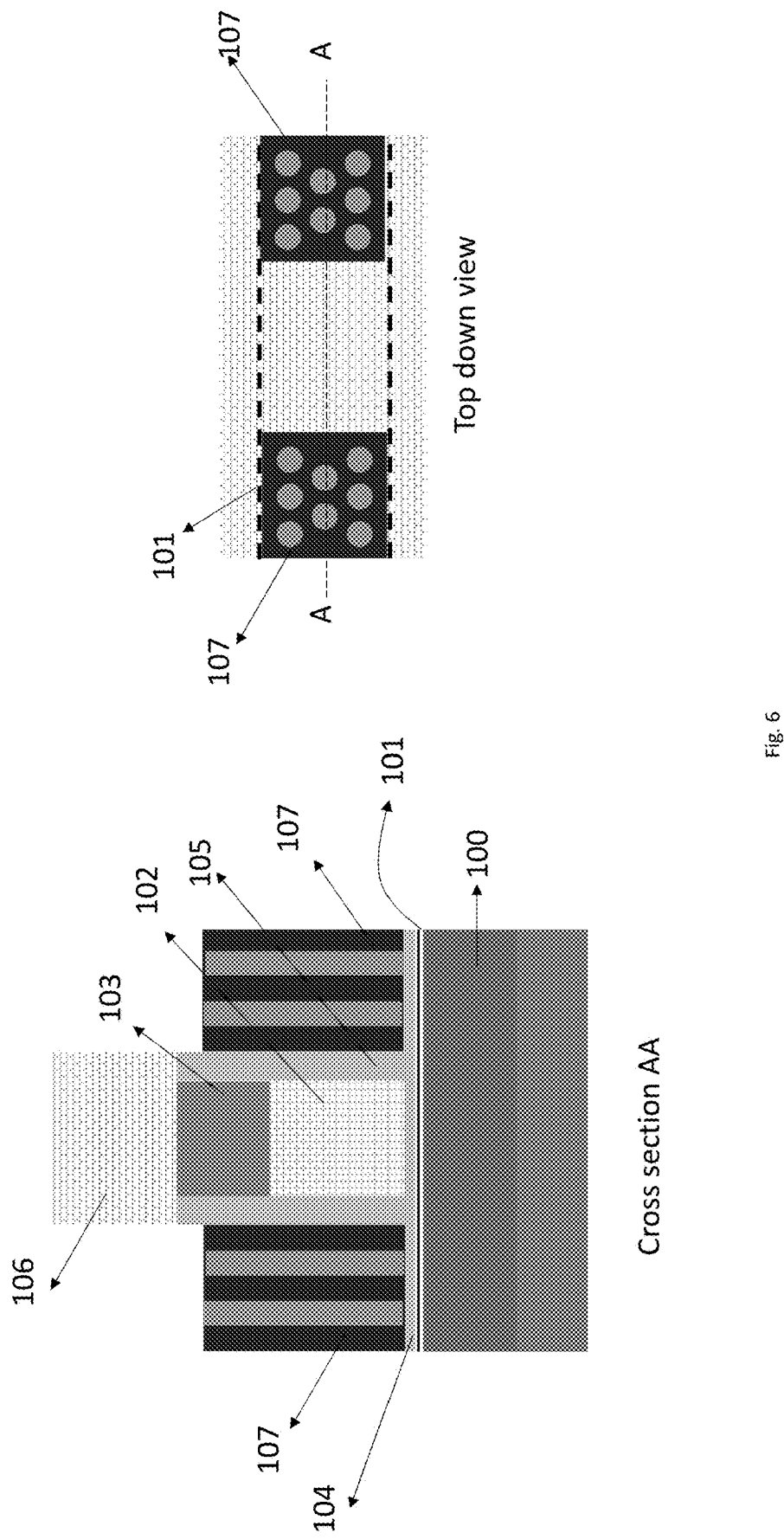
FIG. 6 illustrates a cross section view and a top down view of depositing a cylinder-forming block copolymer into the source and drain region and annealing to induce the directed self-assembly.

FIG. 6 illustrates a cross section view AA and a top down view AA of depositing a cylinder-forming block copolymer coating 107 within a source region and a drain region over the gate dielectric 104 using directed self-assembly. The copolymer microdomains can have a lateral width from about 5 nm to about 50 nm and ranges there between.

Figure 7:
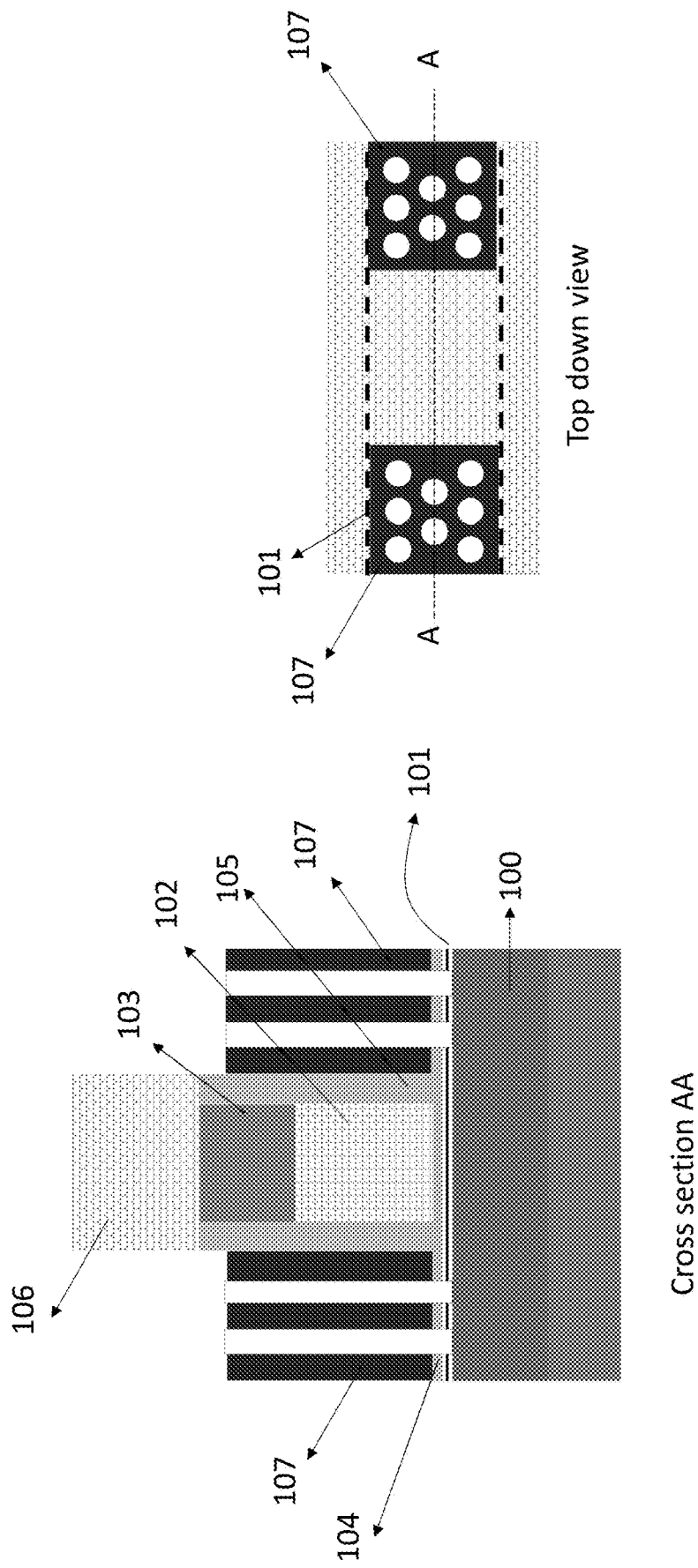
FIG. 7 illustrates a cross section view and a top down view of etching over the copolymer coating; etching the gate dielectric etch using a template to expose the two-dimension material; and performing a two-dimensional material etch over the two-dimensional material.

FIG. 7 illustrates a cross section view AA and a top down view AA of etching over the copolymer coating 107 leaving a mesh template made of polystyrene (PS). The etch can be done using polymethylmethacrylate (PMMA) etching. Next, a gate dielectric etch is used over the gate dielectric 104 to expose the two-dimensional material. Finally, a two-dimensional material etch is performed over the two-dimensional material 101.

Figure 8:
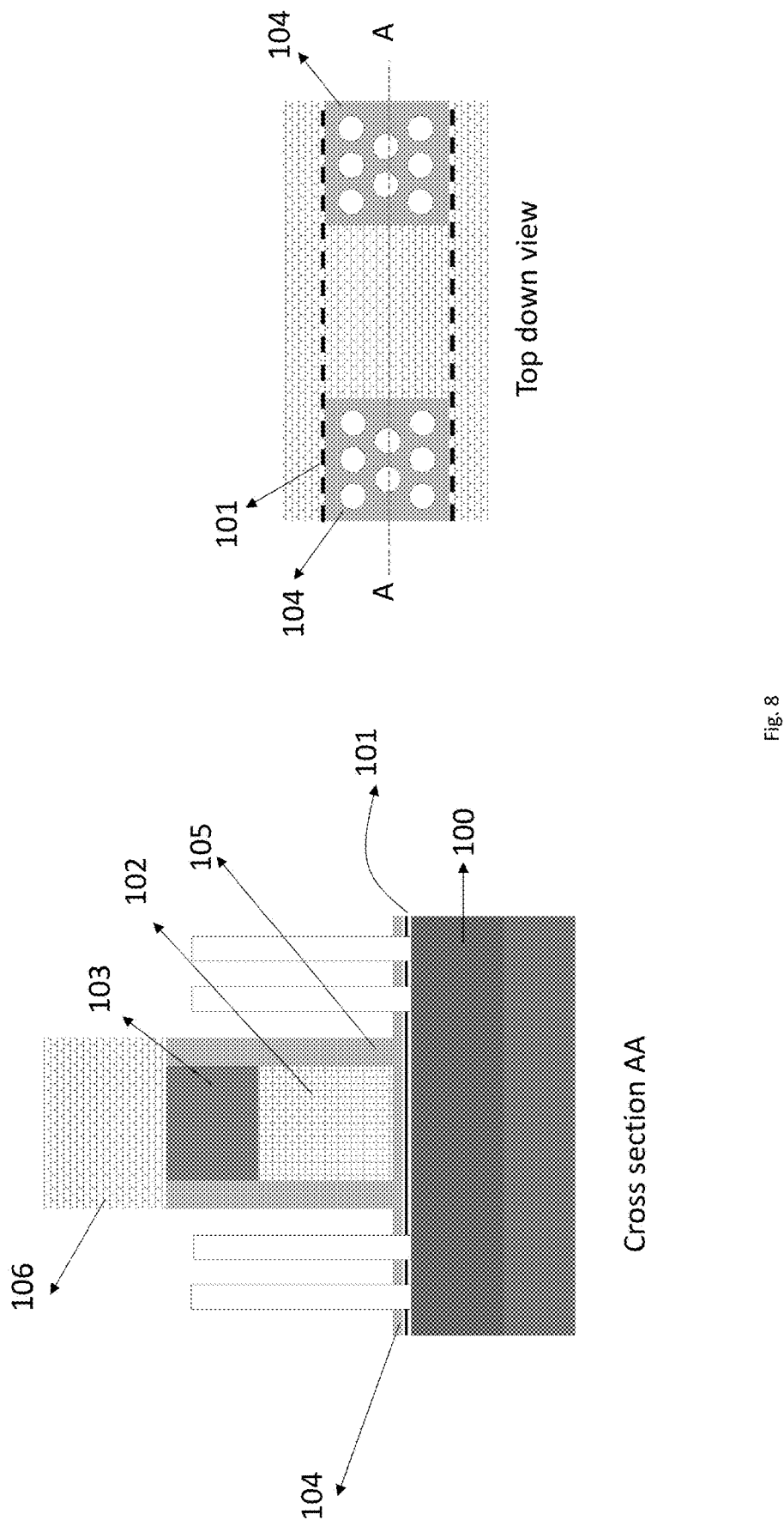
FIG. 8 illustrates a cross section view and a top down view of removing the remaining copolymer coating revealing the patterned gate dielectric in the source region and the drain region.

FIG. 8 illustrates a cross section view AA and a top down view AA of removing the PS template revealing the patterned gate dielectric in the source region and the drain region.

Figure 9:
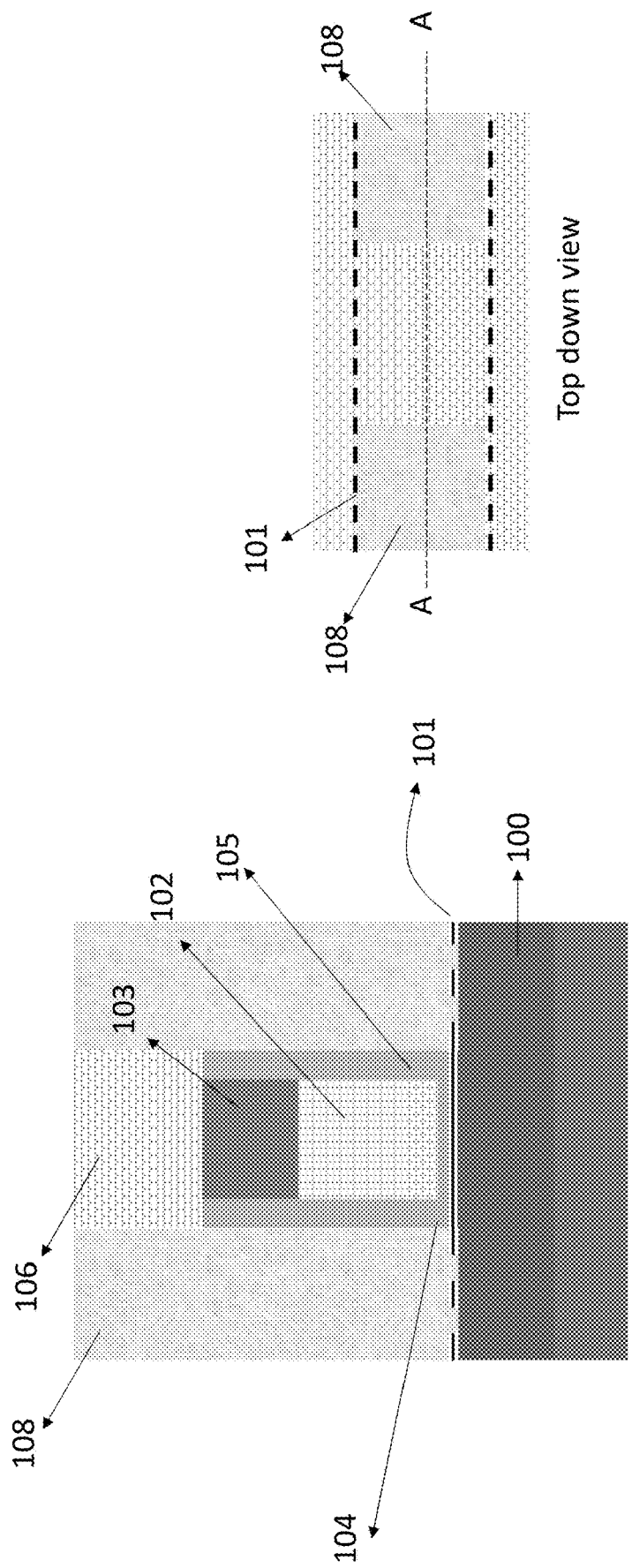
FIG. 9 illustrates a cross section view and a top down view of etching the exposed gate dielectric and forming a gate metal contact layer over the two-dimensional material.

FIG. 9 illustrates a cross section view AA and a top down view AA of etching the exposed gate dielectric 104 and forming a gate metal contact layer 108 over the two-dimensional material 101. The metal contacts both the two-dimensional material surface and the edge of the circular mesh.

Figure 10:
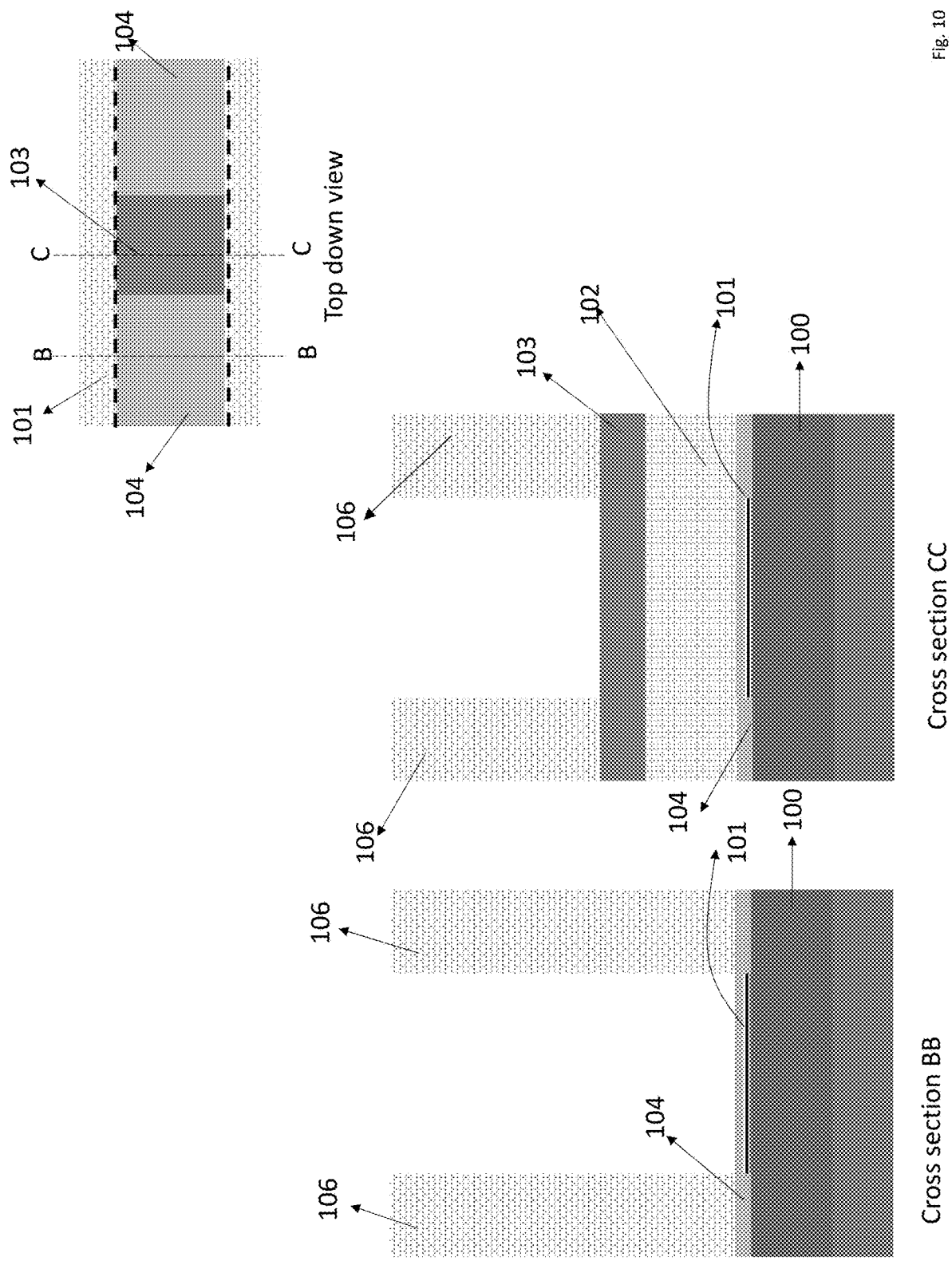
FIG. 10 illustrates a cross section views BB and CC, and a top down view of another embodiment of removing the interlayer dielectric oxide adjacent to the top gate and the hard mask thereon and the source and drain region.

FIG. 10 illustrates a cross section view BB and CC, and a top down view of another embodiment of removing the interlayer dielectric oxide 106 adjacent to the top gate 102 and the hard mask thereon 103 and the source and drain region. Lithography can be used to remove the interlayer dielectric oxide.

FIG. 11 illustrates a cross section view BB and CC, and a top down view of another embodiment of depositing a lamella-forming block copolymer coating 107 within the trench opening in interlayer dielectric oxide including the source and drain region and the region over the gate and annealing to induce the directed self-assembly.

Although illustrative embodiments of the present invention have been described herein, it is to be understood that the invention is not limited to those precise embodiments, and that various other changes and modifications may be made by one skilled in the art without departing from the scope of the invention.

While the present invention has been described in detail in connection with only a limited number of embodiments, it should be readily understood that the present invention is not limited to such disclosed embodiments. Rather, the present invention can be modified to incorporate any number of variations, alterations, substitutions or equivalent arrangements not heretofore described, but which are commensurate with the spirit and scope of the present invention. Additionally, while various embodiments of the present invention have been described, it is to be understood that aspects of the present invention can include only some of the described embodiments. Accordingly, the present invention is not to be seen as limited by the foregoing description but is only limited by the scope of the appended claims.

What is claimed is:

1. A two-dimensional material field effect transistor comprising:
    a two-dimensional material disposed on an insulating substrate;
    a recessed gate dielectric disposed on the two-dimensional material;
    a top gate disposed on the recessed gate dielectric;
    a hard mask disposed on the top gate;
    an interlayer dielectric oxide disposed on the hard mask;

a set of sidewall spacers, wherein each of the set of sidewall spacers is disposed on opposing sides of the recessed gate dielectric, the top gate, and the hard mask, wherein the set of sidewall spacers fails to be disposed along each side of the interlayer dielectric oxide; and a gate metal contact layer disposed on the two-dimensional material and disposed directly on each side of the set of sidewall spacers and on each side of the interlayer dielectric oxide, and wherein a width of the interlayer dielectric oxide is greater than a width of the recessed gate dielectric.

2. The two-dimensional material field effect transistor of claim 1, wherein the gate metal contact layer is electrically insulated from the insulating substrate by a thin layer insulating material.

3. The two-dimensional material field effect transistor of claim 1, wherein the two-dimensional material is graphene.

4. The two-dimensional material field effect transistor of claim 1, wherein the two-dimensional material is hexagonal boron nitride.

5. The two-dimensional material field effect transistor of claim 1, wherein the top gate is amorphous silicon.

6. The two-dimensional material field effect transistor of claim 1, wherein at least one of the set of sidewall spacers is silicon nitride.

7. The two-dimensional material field effect transistor of claim 1, wherein the top gate is amorphous silicon.

8. The two-dimensional material field effect transistor of claim 1, wherein at least one of the set of sidewall spacers has a lateral width from about 4 nanometers (nm) to about 30 nm and ranges between about 4 nm and about 30 nm.

9. The two-dimensional material field effect transistor of claim 1, wherein the insulating substrate has a lateral width from about 5 nanometers (nm) to about 100 nm and ranges between about 5 nm and about 100 nm.

* * * * *